United States Patent [19]
Miyazaki

[11] Patent Number: 5,663,587
[45] Date of Patent: Sep. 2, 1997

[54] FIELD EFFECT TRANSISTOR OF HIGH BREAKDOWN VOLTAGE TYPE HAVING STABLE ELECTRICAL CHARACTERISTICS

[75] Inventor: Yukio Miyazaki, Hyogo-ken, Japan

[73] Assignee: Mitsubishi Denki Kabushiki Kaisha, Tokyo, Japan

[21] Appl. No.: 800,739

[22] Filed: Dec. 4, 1991

Related U.S. Application Data

[63] Continuation of Ser. No. 593,591, Oct. 5, 1990, abandoned, which is a continuation of Ser. No. 200,778, Jun. 1, 1988, abandoned.

[30] Foreign Application Priority Data

Jun. 1, 1987 [JP] Japan .................. 62-138540
Jun. 1, 1987 [JP] Japan .................. 62-138541

[51] Int. Cl.$^6$ .................. H01L 29/94; H01L 31/113
[52] U.S. Cl. .................. 257/337; 257/345; 257/368
[58] Field of Search .................. 357/41, 23, 14; 257/337, 345, 368

[56] References Cited

U.S. PATENT DOCUMENTS 4,280,855  7/1981  Bertin et al. .................. 357/23.4

FOREIGN PATENT DOCUMENTS

| 0033003 | 5/1984 | European Pat. Off. | |
| 1906324 | 9/1969 | Germany | 357/41 |
| 2313196 | 10/1973 | Germany | 357/41 |
| 2545871 | 6/1976 | Germany | |
| 56-15079 | 2/1981 | Japan | 357/23.12 |
| 60-130855 | 7/1985 | Japan | 357/41 |

OTHER PUBLICATIONS

Rodgers, IEEE Journal of Solid State Circuits, vol. SC-10, No. 5, Oct. 1975, p. 322.

Ohta et al, IEEE J. of Solid State Circuits, vol. SC-10, No. 5, Oct. 1975, p. 314.

Plummer et al., "A Monolithic 200-V CMOS Analog Switch", (IEEE Journal of Solid-State Circuits, Dec. 1976), pp. 145-148.

"Analog CMOS Building Blocks for Custom and Semicustom Applications," by Dona C. Stone et al., IEEE Journal of Solid-State Circuits, vol. SC-19, No. 1, Feb. 1984, pp. 55-61.

"Integrated Circuits Design Principles," Warner, Fordemwalt, McGraw Hill Book Company, 1965, pp. 223-228.

"A Coplanar CMOS Power Switch," by Ernst Habekotté et al., IEEE Journal of Solid-State Circuits, vol. SC-16, No. 3, Jun. 1981, pp. 212-225.

"A GaAs Monolithic Low-Noise Broad-Band Amplifier," by John A. Archer et al., IEEE Journal of Solid-State Circuits, vol. SC-16, No. 6, Dec. 1981, pp. 648-652.

"A Family of Differential NMOS Analog Circuits for a PCM Codec Filter Chip," by Daniel Senderowicz et al., IEEE Journal of Solid-State Circuits, vol. SC-17, No. 6, Dec. 1982, pp. 1014-1023.

*Primary Examiner*—Donald Monin
*Attorney, Agent, or Firm*—Lowe, Price, LeBlanc & Becker

[57] ABSTRACT

An FET having a high breakdown voltage comprises a P type semiconductor substrate (5), a plurality of pairs of source regions (S) and drain regions (D) each comprising N$^-$ impurity layers (3) formed in the substrate, gate electrodes (9) each formed through an insulating film over a region interposed between each of the source regions and each of the drain regions, N$^+$ impurity diffused layers (4) formed, shifted by a constant dimension in the N$^-$ impurity diffused layers, a source terminal (7a) connecting a plurality of source regions and a drain terminal (7b) connecting a plurality of drain regions in the plurality of pairs such that a dimensional error caused by shifting is compensated for.

3 Claims, 11 Drawing Sheets

FIELD EFFECT TRANSISTOR OF HIGH BREAKDOWN VOLTAGE TYPE HAVING STABLE ELECTRICAL CHARACTERISTICS

This application is a continuation application of application Ser. No. 07/593,591, filed Oct. 5, 1990 now abandoned, which is a continuation application of application Ser. No. 07/200,778, filed Jun. 1, 1998 now abandoned.

BACKGROUND OF THE INVENTION

1. Field of the Invention

The present invention relates generally to field effect transistors (referred to as FETS hereinafter) requiring a high breakdown voltage, and more particularly, to FETs of a high breakdown voltage type having stable electrical characteristics.

2. Description of the Prior Art

An analog circuit and an analog switch in a CMOS (complementary metal oxide semiconductor) require a high breakdown voltage. The reason for this is that the effect of noise is reduced if an operating voltage is high when the analog circuit includes noise.

Figure 1:
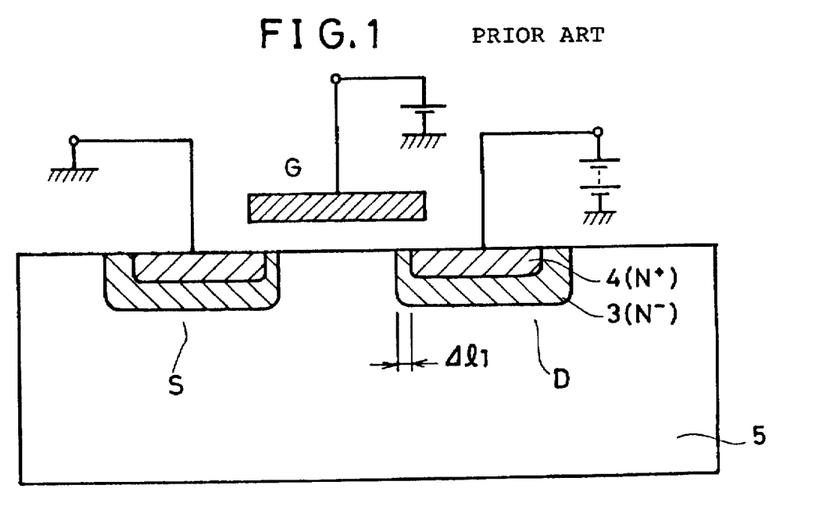
FIG. 1 is a diagram showing an FET of an LDD type.

FIG. 1 shows an example of an MOS transistor having a high breakdown voltage. The transistor is referred to as an LDD (Lightly Doped Drain) transistor. The LDD transistor comprises a P type semiconductor substrate 5, a source S and a drain D each having an $N^-$ impurity diffused layer 3 and an $N^+$ impurity diffused layer 4 formed in the major surface of the substrate 5, and a gate G formed through an insulating film over a region interposed between the source S and the drain D. Since the LDD transistor includes the region 3 having a low concentration, occurrence of a high electric field in the vicinity of the drain D is restrained. Thus, dielectric breakdown does not easily occur in the high electric field portion which appears in the drain region.

However, in the LDD-transistor, the dimension ($\Delta l_1$ in FIG. 1) of the $N^-$ region can be only slightly adjusted. The reason for this is that the gate G is provided with a sidewall or the like so that the $N^-$ diffusion region is formed. So the effect obtained by using the LDD transistor is small. Thus, if a higher breakdown voltage is required, the LDD transistor is not employed. More specifically, in a transistor having a higher breakdown voltage, the $N^-$ diffusion region must be formed by mask alignment.

Figure 2A:
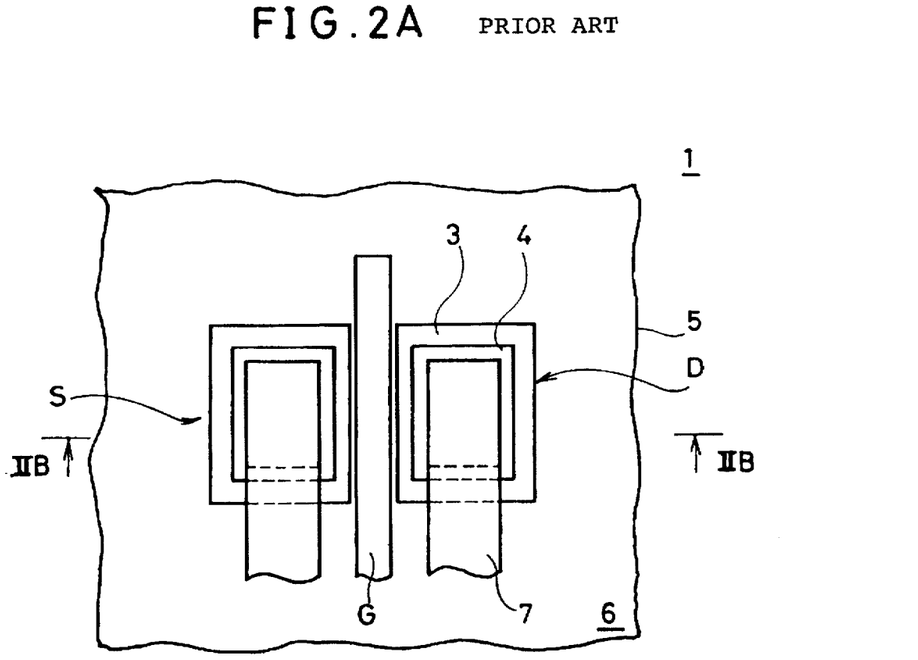
FIG. 2A is a plan view showing a conventional FET having a high breakdown voltage type.
Figure 2B:
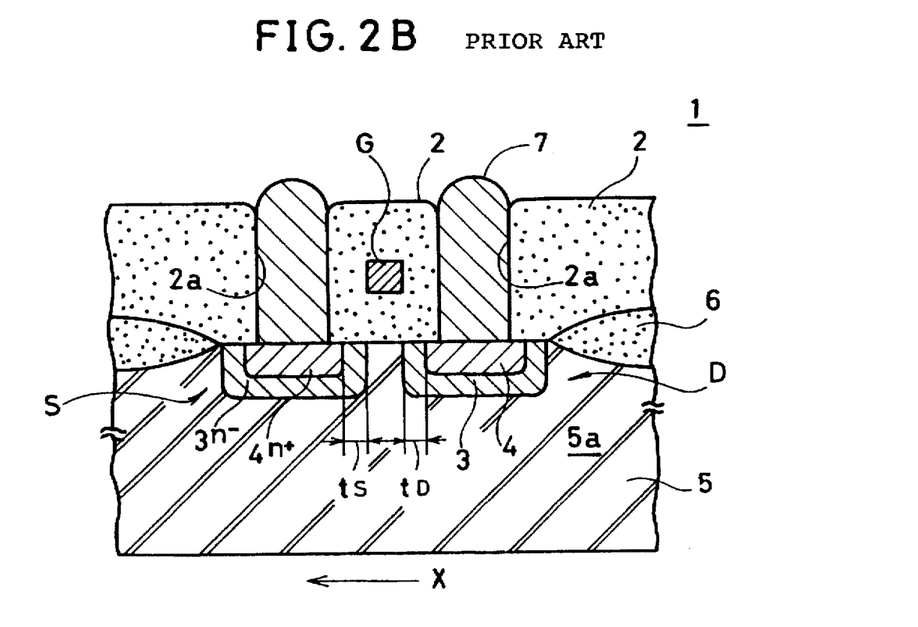
FIG. 2B is a cross sectional view of a portion taken along a line IIB—IIB shown in FIG. 2A.

FIG. 2A is a plan view showing the conventional FET having a high breakdown voltage, and FIG. 2B is a cross sectional view of a portion along a line IIB—IIB shown in FIG. 2A. Referring to FIGS. 2A and 2B, the conventional FET having a high breakdown voltage comprises a P type semiconductor substrate 5, a source S and a drain D formed in the major surface of the semiconductor substrate 5, and a gate electrode G formed through an insulating, film 2 over a region interposed between the source S and the drain D. In general, the gate electrode G is formed of polysilicon (polycrystalline silicon) and the insulating film is formed of a silicone oxides film. The gate electrode of polysilicon, the silicon oxide film and the semiconductor substrate constitute a so-called MOS structure (generally referred to as MIS structure). The source S and the drain D each have a double diffusion layer comprising an $N^-$ diffusion region 3 having a low n-type impurity concentration and an $N^+$ diffusion region 4 having a high n-type impurity concentration. The source S and the drain D are connected to an aluminum interconnection 7, respectively. The entire FET is separated from the other elements by a field oxide film 6.

As is shown in the drawing, the source S and the gate G have prescribed width of $N^-$ diffusion regions 3, $t_S$ and $t_D$.

Description is now made of the reason why the above described FET having the double diffusion layer has a high breakdown voltage.

Figure 3A:
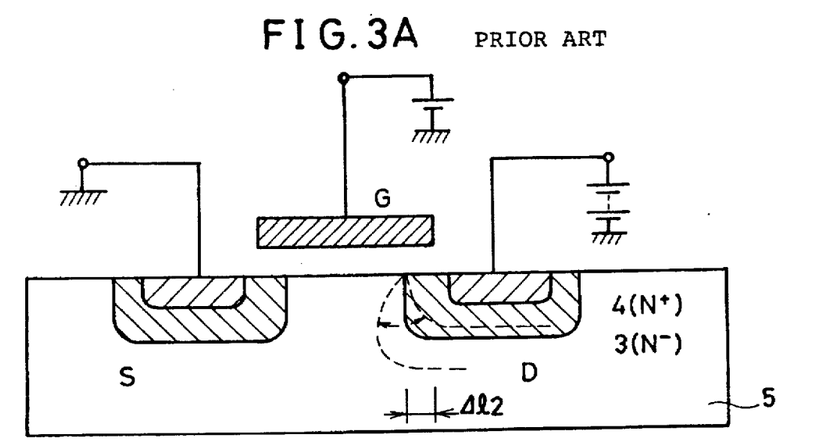
FIG. 3A is a typical diagram showing a transistor having a double fusion layer.
Figure 3B:
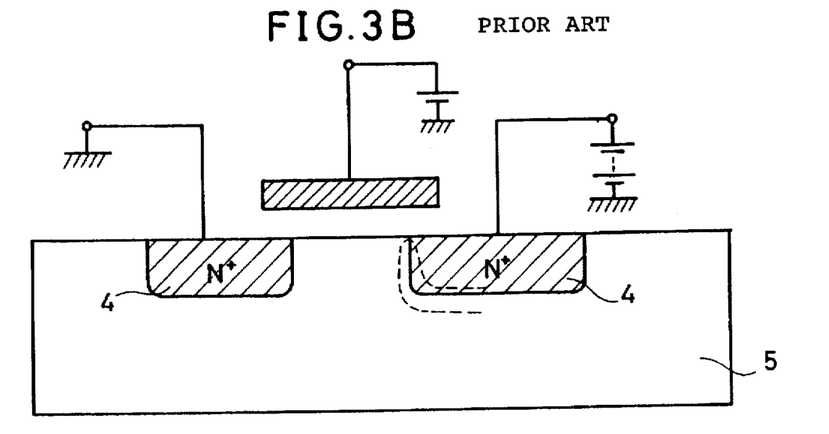
FIG. 3B is a typical diagram showing an ordinary transistor having only an N⁺ diffusion layer.

FIG. 3A is a typical diagram showing a transistor having a double diffusion layer, and FIG. 3B is a typical diagram showing a transistor having only an ordinary $N^+$ diffusion layer. Description is made on the case in which an $N^+$ type diffusion layer is formed in the major surface of the P type semiconductor substrate. Referring to FIG. 3B, in the ordinary transistor, a positive potential is applied to the gate G and the drain D, and the source is grounded. At that time, a depletion layer (represented by a dotted line in FIG. 3B) expands into the substrate and the $N^+$ diffusion region 4. The depletion layer freely expands into the substrate but hardly expands into the $N^+$ diffusion region 4 because a large amount of electrons exist therein. As a result, breakdown occurs.

On the other hand, if there is a relatively large dimension ($\Delta l_2$ in FIG. 3A) between the $N^-$ diffusion region layer and the $N^+$ diffusion region, the depletion layer may expand into not only the substrate but also the direction of the $N^+$ diffusion region. As a result, the breakdown voltage rises.

Thus, if the $N^-$ diffusion region is provided around the $N^+$ diffusion region, not only the breakdown voltage rises but also considerable gain is obtained. The reason for this is that the resistance of the $N^-$ diffusion region is too high. In other words, the resistance of the FET with both high and low impurity concentration region is much less than that with only low density region. The dimension $\Delta l_2$ (in FIG. 3A) is substantially larger than the dimension $\Delta l_1$ (see FIG. 1) in the above described LDD transistor. Thus, the transistor of a high breakdown voltage type shown in FIG. 2 has a substantially larger breakdown voltage (for example, approximately 18 V) than that of the LDD transistor.

FIGS. 4A to 4I are diagrams showing the sequential steps of the manufacturing process of the conventional FET of a high breakdown voltage type. Referring to FIGS. 4A to 4I, description is made on the manufacturing process of the conventional FET of a high breakdown voltage type. A P type silicon substrate 5 is prepared. A double film comprising a silicon oxide film 21 and a silicon nitride film 22 is formed on the major surface thereof (in FIG. 4A). A photoresist 23 is formed on the silicon nitride film 22, to be patterned (in FIG. 4B). The silicon substrate 5 is thermally oxidized, so that a field oxide film 6 is formed (in FIG. 4C). A silicon nitride film 24 is removed. A polysilicon layer 25 is formed on the silicon oxide film 21 (in FIG. 4D), to be patterned as a gate G. Arsenic, for examples is ion-implanted from above the substrate 5 utilizing a polysilicon gate G and the field oxide film 6 as a mask, so that an $N^-$ diffusion region 4 is formed in the major surface of the substrate 5 (in FIG. 4E). A silicon oxide film 26 is formed on the major surface of the substrate 5, the gate G and the field oxide film 6 (in FIG. 4F). A mask layer 27 is formed in a predetermined position on the silicon oxide film 26. Arsenic, for example, having a higher concentration than that in the last ion implantation are ion-implanted from above the mask, so that the $N^+$ diffusion region 4 is formed in an $N^-$ diffusion region 3 (in FIG. 4H). Aluminum interconnections are connected to a sources S and a drain D each comprising the $N^+$ diffusion region 4 and the $N^-$ diffusion region 3 and the gate G respectively (in FIG. 4I).

The conventional FET of a high breakdown voltage type is manufactured by the foregoing process. The $N^+$ diffusion layer is formed by mask alignment (in FIG. 4G). Thus, when an error of mask alignment occurs, the position of the $N^+$ diffusion region 4 is shifted. As a result, the dimension (ΔR and ΔL in FIG. 4H,) on the side of the gate of the N⁻ diffusion region 3 may not be equal.

Figure 5:
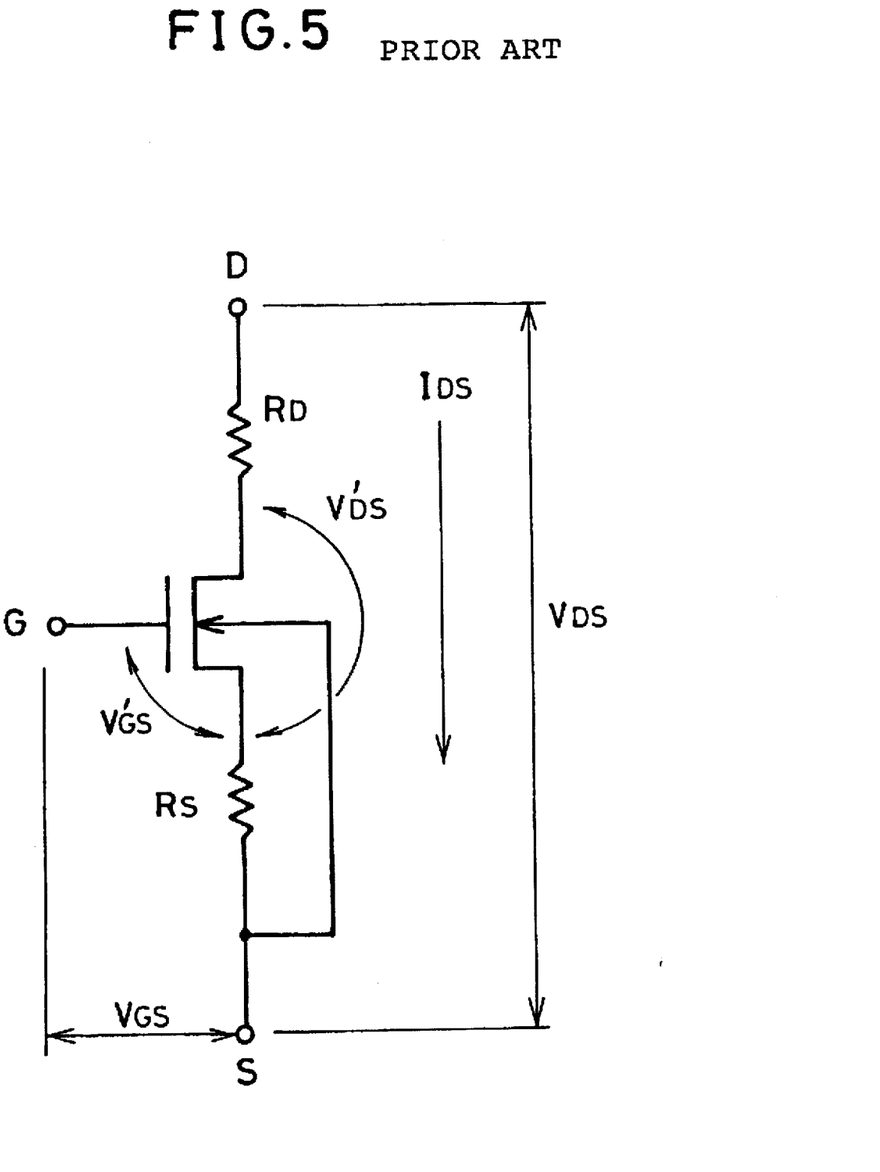
FIG. 5 is a diagram showing an equivalent circuit of the conventional FET of a high breakdown voltage type.

FIG. 5 is a diagram showing an equivalent circuit of the conventional FET of a high breakdown voltage type shown in FIGS. 2A and 2B. Referring to FIG. 5, the equivalent circuit of the conventional FET of a high breakdown voltage type comprises resistances $R_D$ and $R_S$ on the side of the drain, D and the source S, respectively. The reason for this is as follows: There exists an N⁻ diffusion region having a low impurity concentration between the drain D and the source S. Since the impurity concentration of the N⁻ diffusion region is low, the electric resistance thereof is high. As a result, when a current $I_{DS}$ flows between the source S and the drain D, the resistance can not be neglected. Thus, a substantial voltage $V_{DS}$ between the drain D and the source S and a substantial voltage $V'_{GS}$ between the gate G and the source S are affected by the voltage drop caused by the resistances $R_D$ and $R_S$. In general, assuming that an on-voltage of the MOSFET is represented by $V_{TH}$, the current $I_{DS}$ flowing between the drain D and the source S of the MOSFET is represented by the following equation:

$$I_{DS} = K(V'_{GS} - V_{TH})^2 \quad (1)$$

The equation (1) is described in "MOSFET in Circuit Design", R. H. Crawford Texas Instruments Electronics Series McGRAW HILL, pp. 51. Thus, the voltage drop caused by the resistances $R_D$ and $R_S$ also affects the current $I_{DS}$. Symbol K in the equation (1) is the constant.

Referring now to FIG. 5, description is specifically made of the effect on the current $I_{DS}$. For of illustration, let $V_{TH}$=0.5 V. It is assumed that the voltage $V_{GS}$ of 5 V is applied between the gate G and the source S in order to reverse a channel. At that time, the current $I_{DS}$ flows between the source S and the drain D, so that the voltage drop caused by the resistance $R_S$ is developed. Assuming that the voltage drop caused by the resistance. $R_S$, i.e., ($I_{DS} \cdot R_S$) is 0.5 V, a substantial voltage $V'_{GS}$ of the transistor is equal to $V_{GS} - I_{DS} \cdot R_S$. More specifically, without the resistance $R_S$, $I_{DS} \approx K (5-0.5)^2 \approx 20K$. However, $I_{DS} \approx K(4.5-0.5)^2 \approx 16K$ due to the resistance $R_S$. Since $I_{DS}$ is proportional to the second power of ($V'_{GS} - V_{TH}$), the resistance $R_S$ significantly affects the current $I_{DS}$.

As can be seen from the foregoing, in order to obtain an MOSFET having stable electrical characteristics, it is important to decrease the variation in the widths $t_D$ and $t_S$ (in FIG. 2B) of the N⁻ diffusion region 3 on the side of the channel region, since the N⁻ diffusion region 3 has high electric resistance as much as possible.

Figure 4A:
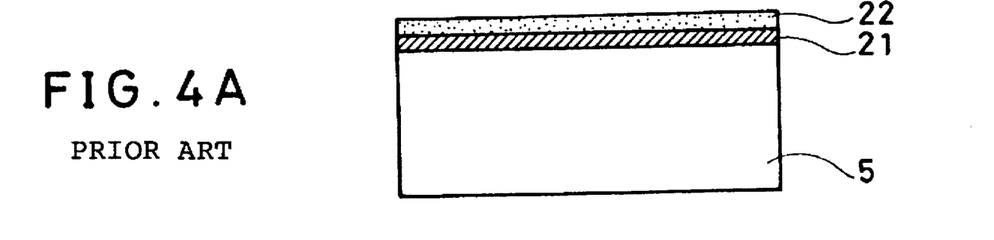
FIGS. 4A to 4I are digrams showing the sequential steps of the manufacturing process of the conventional FET of a high breakdown voltage type.
Figure 4B:
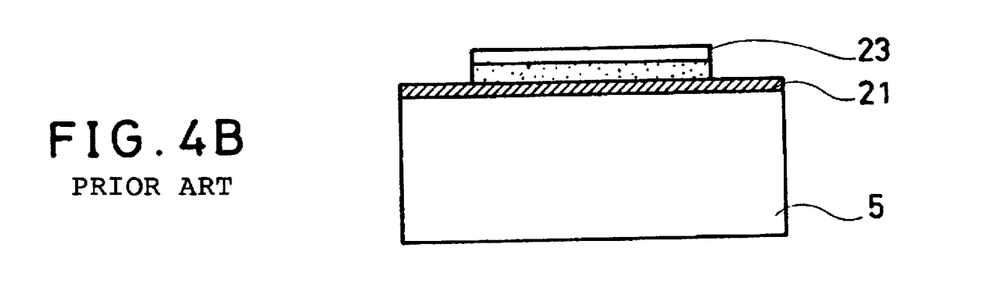
Figure 4C:
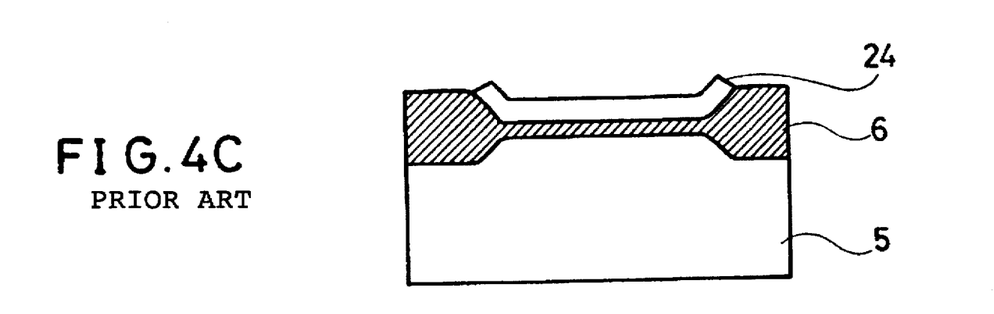
Figure 4D:
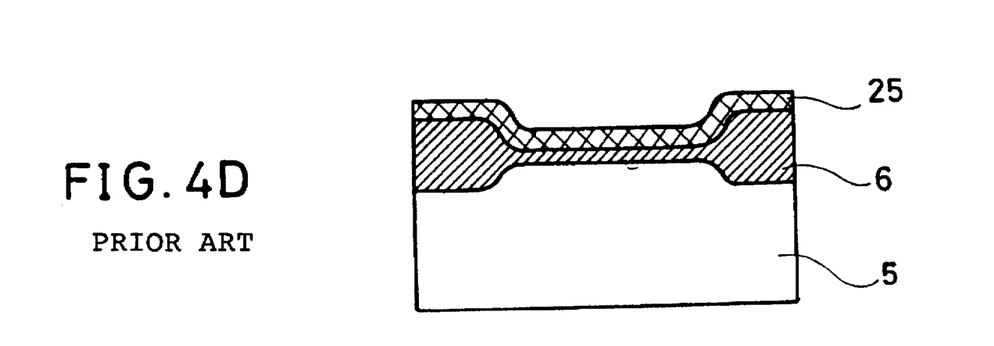
Figure 4E:
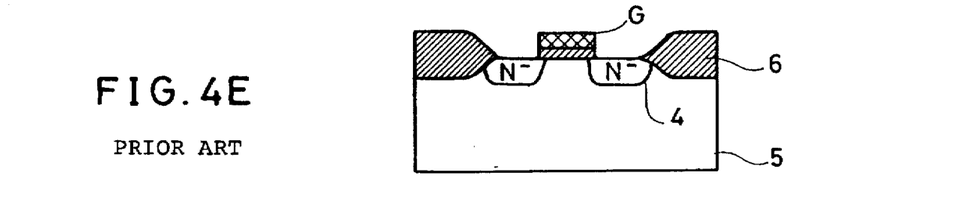
Figure 4F:
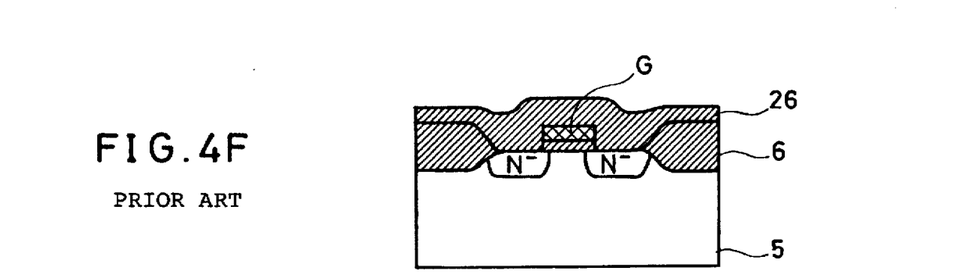
Figure 4G:
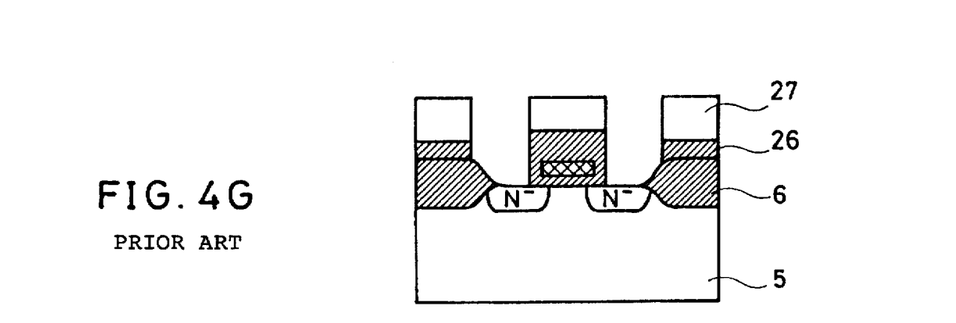
Figure 4H:
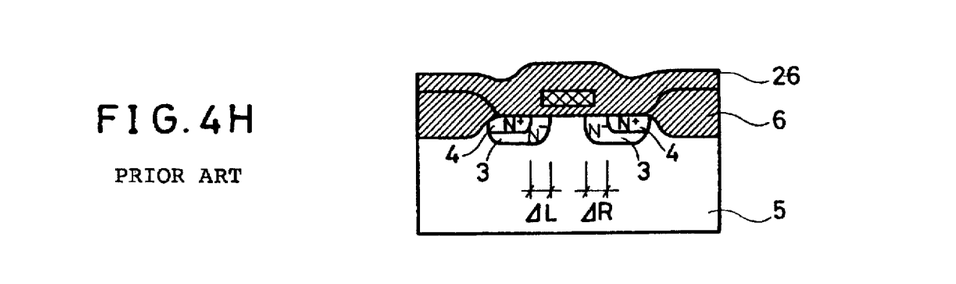
Figure 4I:
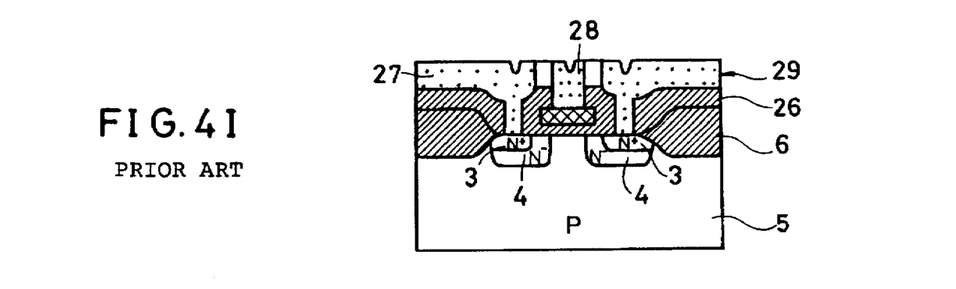

In such an MOSFET, the N⁻ diffusion region 3 is formed in the exact position by the gate electrode G and field mask 6 (see. FIG. 4E). On the other hand, the N⁺ diffusion region 4 is formed by mask alignment (see FIG. 4G). As a result, the position where the N⁺ diffusion region 4 is formed, can be shifted by the error of mask alignment. Thus, the N⁺ diffusion region 4 is formed, shifted left (in the direction represented, by an arrow X in FIG. 2B), for example, the width $t_D$ on the side of the gate G of the N⁻ diffusion region 3 included in the drain D is decreased ($t_D$) while the width $t_S$ on the side of the gate G of the N⁻ diffusion region 3 included in the source S is increased ($t_S$). In this state, the resistance $R_D$ is decreased while the resistance $R_S$ is increased, in FIG. 5. As a result, the voltage drop caused by the resistance $R_S$ is increased, so that the voltage $V'_{GS}$ between the gate G and the source S is decreased. Consequently, the current $I_{DS}$ given by the equation (1) is decreased. Contrary to this, if the N⁺ diffusion region 4 is formed, shifted right, the current $I_{DS}$ is increased.

As described in the foregoing, the MOSFET having the structure as shown in FIGS. 2A and 2B has a high breakdown voltage. On the other hand, the current flowing therein, or the like is affected by the error of mask alignment. As a result, it is difficult to provide an MOSFET having stable electrical characteristics.

SUMMARY OF THE INVENTION

Therefore, an object of the present invention is to provide an FET having a double diffusion layer which is electrically stable.

Another object of the present invention is to provide an FET of a high breakdown voltage type which is electrically stable.

Still another object of the present invention is to provide an FET having a double diffusion layer in which electrical characteristics are not affected by an error of mask alignment in the manufacturing process.

Yet still another object of the present invention is to provide an FET of a high breakdown voltage type in which electrical characteristics are not affected by an error of mask alignment in the manufacturing process.

A further object of the present invention is to provide an FET having a double diffusion layer which is electrically stable, in which any of conductive layers and impurity regions are arranged in a line manner.

A still further object of the present invention is to provide an FET comprising a plurality of unit FETS whose impurity regions are formed in line having a double diffusion layer and electrically stable.

In order to attain the above described objects, the FET according to the present invention comprises a semiconductor substrate of a first conductivity type having a mayor surface and a predetermined impurity concentration; a plurality of pairs of first impurity regions of a second conductivity type formed spaced apart from each other at predetermined intervals in the major surface of the semiconductor substrate each having a first impurity concentration, a region in the major surface of the semiconductor substrate and between the first impurity regions of the second conductivity type in each of the pairs defining a channel region; conductive layers formed over the channel regions through an insulating film and connected to each other; second impurity regions of the second conductivity type formed in the major surface of the semiconductor substrate and in the first impurity regions of the second conductivity type each having a second impurity concentration higher than the first impurity concentration; a first terminal connecting either one of the second impurity regions of the second conductivity type in a pair of the pairs with either one of the second impurity regions of the second conductivity type in another pair of the pairs; and a second terminal connecting the remaining one of the second impurity regions of the second conductivity type in the pair with the remaining one of the second impurity regions of the second conductivity type in the other pair.

The FET has the above described structure, even if there occurs the difference between dimensions of the plurality of impurity regions having a low concentration in the FET, the impurity regions are connected to each other such that the difference therebetween is minimized. As a result, there is provided an FET which is electrically stable.

In accordances with one aspect of the present invention, the second impurity regions of the second conductivity type are formed, shifted by a constant dimension in a constant direction in the first impurity regions of the second conductivity type, so that one of the first impurity regions of the second conductivity type in each of the pairs has a first width on the side of the channel region, and the other of the first impurity regions of the second conductivity type in the pair has a second width which is different from the first width on the side of the channel region. In addition, the first terminal connects one or the second impurity regions of the second conductivity type in a pair with the other of the second impurity regions of the second conductivity type in another pair, and the second terminal connects the other of the second impurity regions of the second conductivity type in the pain with one of the second impurity regions of the second conductivity type in the other pair. The FET has the above described structure, the dimensional error caused by mask alignment in the impurity regions in the manufacturing process is cancelled. As a result, there is provided an FET having a double diffusion layer which is electrically stable.

In accordance with another aspect of the present invention, an odd number of (three or more) first impurity regions of the second conductivity type are formed in a line manner, the adjacent first impurity regions of the second conductivity type constituting each pair, and the second impurity regions of the second conductivity type are formed, shifted in the line direction. In addition, the first terminal connects the second impurity regions of the second conductivity type arranged in odd numbers. The FET has the above described structure, there is provided an FET having a double diffusion layer which is electrically stable, in which impurity regions are arranged in a line manner.

In accordance with still another aspect of the present inventions, a plurality of pairs of first impurity regions of the second conductivity type are arranged in parallel such that the conductive layers are arranged in a line manner, and the second impurity regions of the second conductivity type are formed, shifted in the direction intersecting with the line direction. Thus, there is provided an FET having a double diffusion layer which is electrically stable, in which conductive layers are arranged in a line manner.

These objects and other objects, features, aspects and advantages of the present invention will become more apparent from the followings detailed description of the present invention when taken in conjunction with the accompanying drawings.

DESCRIPTION OF THE PREFERRED EMBODIMENTS

Figure 6A:
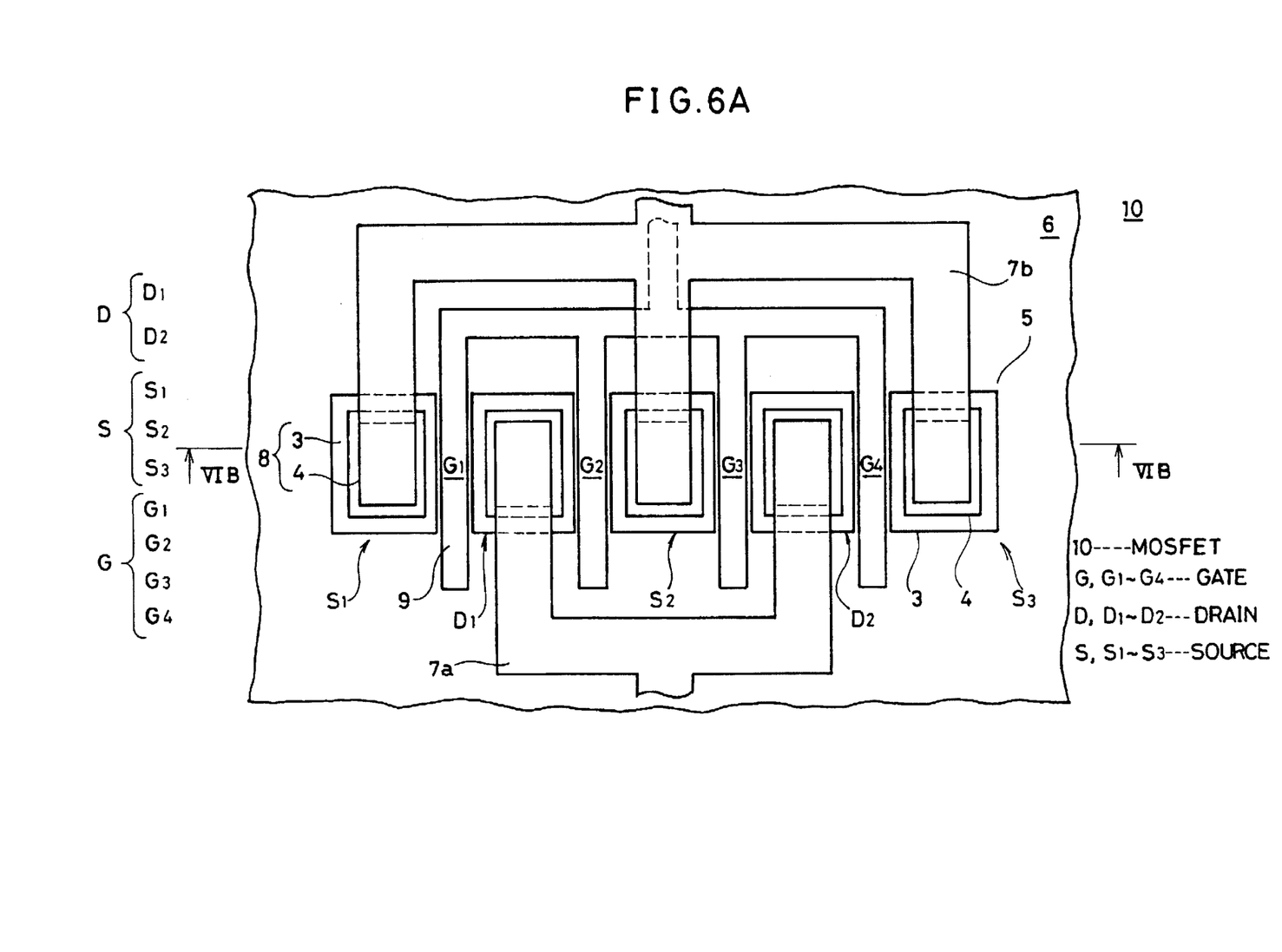
FIG. 6A is a plan view showing an MOSFET according to the present invention.
Figure 6B:
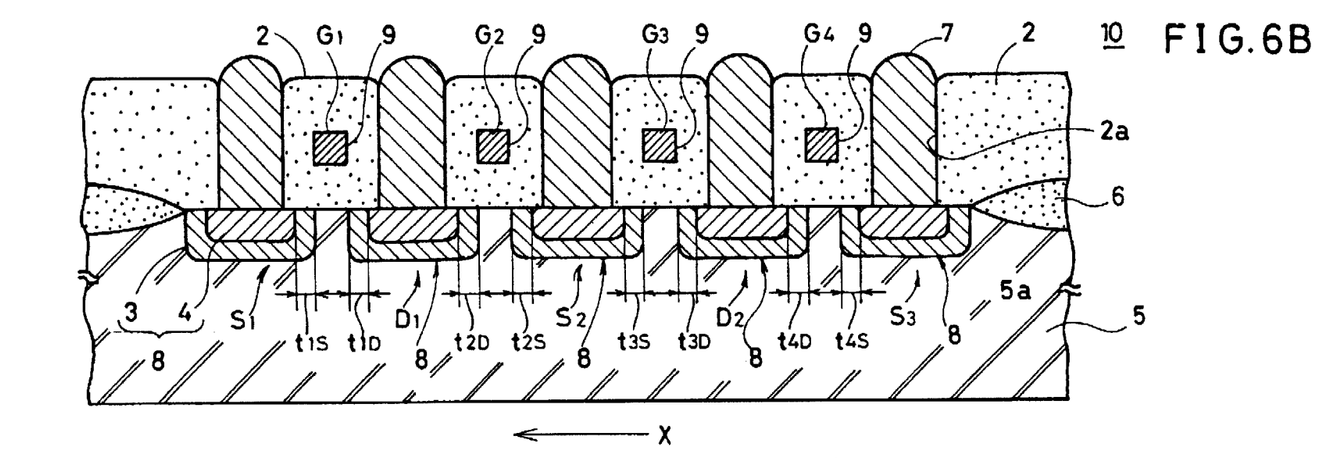
FIG. 6B is a cross sectional view of a portion taken along a line VIB—VIB shown in FIG. 6A.

FIG. 6A is a plan view-showing an MOSFET according to the present invention and FIG. 6B is a cross sectional view of a portion taken along a line VIB—VIB shown in FIG. 6A.

Referring to FIG. 6A and 6B the MOSFET, according to the present invention comprises a semiconductor substrate 5, five impurity diffused regions (active regions) 8 formed spaced apart from each other at predetermined intervals in the major surface of the semiconductor substrate 5, four gate electrodes 9 each provided through an insulating film 2 over a region between the adjacent impurity diffused regions 8, a field oxide film 6 for separating the impurity diffused regions 8 from the other impurity diffused regions or the like, conductive layers 9 for connecting the four gate electrodes 9 to each other, and aluminum interconnections 7a and 7b for connecting the impurity diffused regions 8 to each other. Each of the impurity diffused regions 8 comprises an N⁻ diffusion region 3 having a low diffusion concentration and an N⁺ diffusion region 4 having a high diffusion concentration. The five impurity diffused regions 8 are alternately connected to each other by the aluminum interconnections 7a and 7b. Consequently, the five impurity diffused regions 8 alternately become drain regions D ($D_1$ and $D_2$) and source regions S ($S_1$ to $S_3$). According to the present embodiment, the five impurity diffused regions 8 become a source $S_1$, a drain $D_1$, a source $S_2$, a drain $D_2$ and a source $S_3$ in that order from the left, as shown in FIG. 6B. An insulating film 2 (not shown in FIG. 6A) is formed on the major surface of the silicon substrate 5. Each of the conductive layers 9 of polysilicon or the like is formed over a region between the adjacent impurity diffused regions 8. Four (generally a plurality of) MOS structures (generally MIS structures) in all are formed between the adjacent impurity diffused regions 8, respectively. An even number of conductive layers 9 included in the MOS structures are connected to each other. As a result, gates G ($G_1$ to $G_4$) are formed.

Thus, each of drains $D_1$ and $D_2$ and the source $S_2$ are a common drain or source with respect to two gates G adjacent thereto. For example, the drain $D_1$ is a common drain with respect to the gates $G_1$ and $G_2$.

Figure 7:
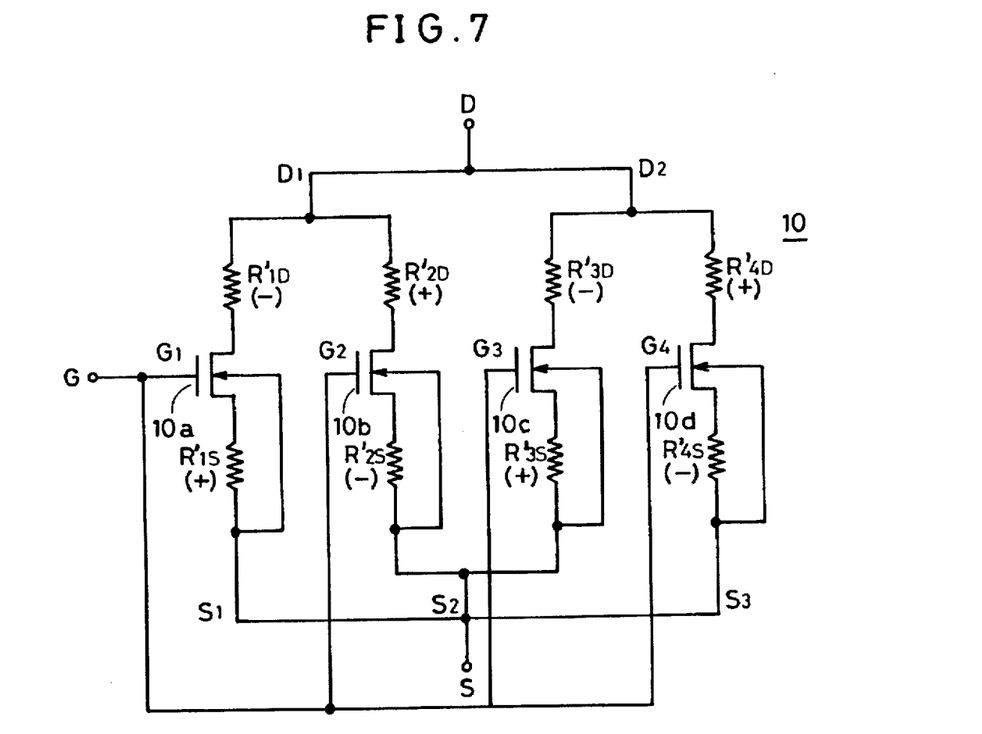
FIG. 7 is a diagram of showing an equivalent circuit an FET according to a first embodiment of the present invention.

FIG. 7 is a diagram showing an equivalent circuit of the MOSFET shown in FIGS. 6A and 6B. Referring to FIG. 7, an MOSFET 10 is an equivalent to the parallel connection of four unit MOSFET 10a to 10d separated from each other.

Figure 8:
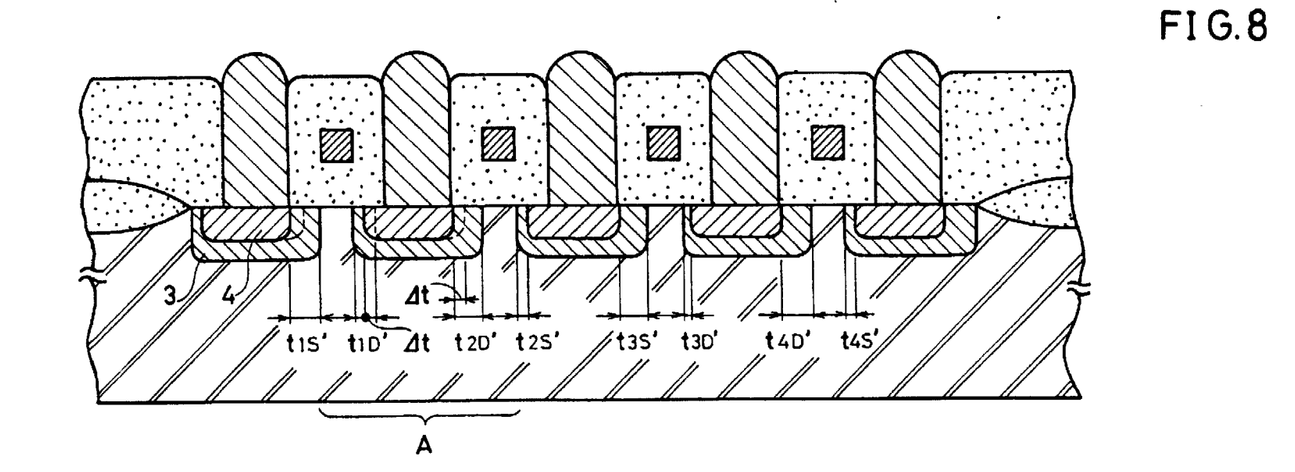
FIG. 8 is a diagram corresponding to FIG. 6B, in which an error of mask alignment occurs.

FIG. 8 shows the case in which in the MOSFET 10 having the above described structure, respective N⁺ diffusion regions 4 are formed, shifted, for example, left (in the direction represented by an arrow X in FIG. 6B) by an error of mask alignment.

Referring to FIG. 8, all of the widths $t_{1d}$, $t_{2S}$, $t_{3D}$ and $t_{4S}$ of portions adjacent to the left of the N⁺ diffusion regions 4 in the N⁻ diffusion regions 3 are decreased by an error $\Delta t$ (portion A in FIG. 8) of mask alignment. As a result, $t_{1D}$, $t_{2S}$, $t_{3D}$ and $t_{4S}$ become $t_{1D''}$, $t_{2S''}$, $t_{3D''}$ and $t_{4S''}$, respectively. On the other hand, the widths $t_{1S}$, $t_{2D}$, $t_{3S}$ and $t_{4D}$ of portions adjacent to the right of the N$^+$ diffusion regions 4 in the N$^-$ diffusion regions 3 are increased by the error $\Delta t$ of mask alignment as a result. $t_{1S}$, $t_{2D}$, $t_{3S}$ and $t_{4D}$ become $t_{1S''}$, $t_{2D''}$, $t_{3S''}$ and $t_{4D''}$, respectively. The resistance values presented in the N$^-$ diffusion regions 3 are decreased in the former portions while being increased in the latter portions. One of the reasons of the width variations is that the N$^-$ diffusion regions 3 are arranged linearly.

Referring to the equivalent circuit shown in FIG. 7, description is made on this state. Resistances $R_{1S}$, $R_{2D}$, $R_{3S}$ and $R_{4D}$ each having a "+" mark are increased with increasing the width $t_{1S}$, $t_{2D}$, $t_{3S}$ and $t_{4D}$ shown in FIG. 8. Resistances $R_{1D}$, $R_{2S}$, $R_{3D}$ and $R_{4S}$ each having a "–" mark are decreased with decreasing the width $t_{1D}$, $t_{2S}$, $t_{3D}$ and $t_{4S}$.

Figure 9:
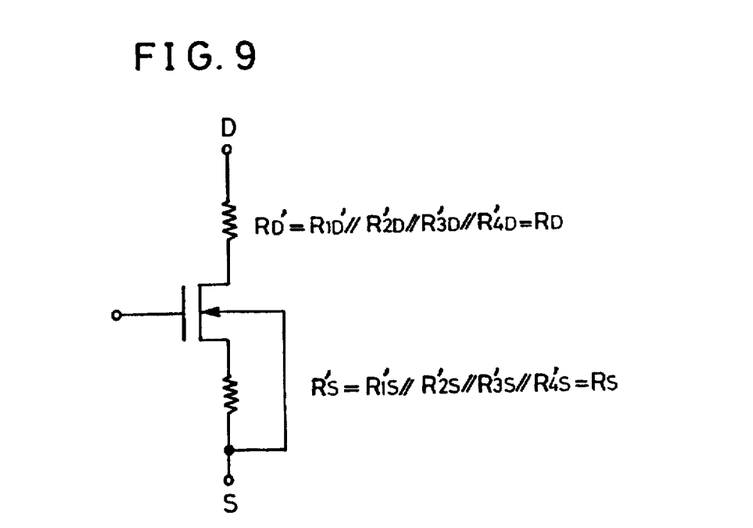
FIG. 9 is a diagram corresponding to FIG. 5, in which an error of mask alignment occurs.

FIG. 9 is a diagram obtained by simplifying the equivalent circuit shown in FIG. 7. $R_D$ depends on $R_{1D}$, $R_{2D}$, $R_{3D}$ and $R_{4D}$ shown in FIG. 7, and $R_S$ is the sum of $R_{1S}$, $R_{2S}$, $R_{3S}$ and $R_{4S}$ shown in FIG. 7. It is assumed that the resistance values presented when the error $\Delta t$ of mask alignment shown in FIG. 8 does not occur are represented by $R_{1D}$, $R_{2D}$, $R_{3D}$, $R_{4D}$, $R_{1S}$, $R_{2S}$, $R_{3S}$, and $R_{4S}$, and the amount of change in the resistance values caused by the error of mask alignment is represented by $\Delta R$. $R_D$ and $R_S$ in the circuit shown in FIG. 9 are represented by the following equations:

$$\begin{aligned} R_D &= R_{1D}//R_{2D}//R_{3D}//R_{4D} \\ &= (R_{1D} - \Delta R)//(R_{2D} + \Delta R)//(R_{3D} - \Delta R)//(R_{4D} + \Delta R) \\ &= R_{1D}//R_{2D}//R_{3D}//R_{4D} \\ &= R_D \\ R_S &= R_{1S}//R_{2S}//R_{3S}//R_{4S} \\ &= (R_{1S} + \Delta R)//(R_{2S} - \Delta R)//(R_3 + \Delta R)//(R_4 + \Delta R) \\ &= R_{1S}//R_{2S}//R_{3S}//R_{4S} \\ &= R_S \end{aligned}$$

where $R_D$ and $R_S$ are resistance values of the drain and the source presented when the error of mask alignment does not occur. As obvious from the above equations, a substantial combined value of the resistances $R_{1D}$ to $R_{4D}$ on the side of the drain D and a substantial combined value of the resistances $R_{1S}$ to $R_{4S}$ on the side of the source S become zero or values close to zero, respectively. As a result, $V_{GS}$ and $V_{DS}$ in the equations (1) do not substantially change irrespective of the error of mask alignment, so that the current $I_{DS}$ hardly changes.

Figure 10A:
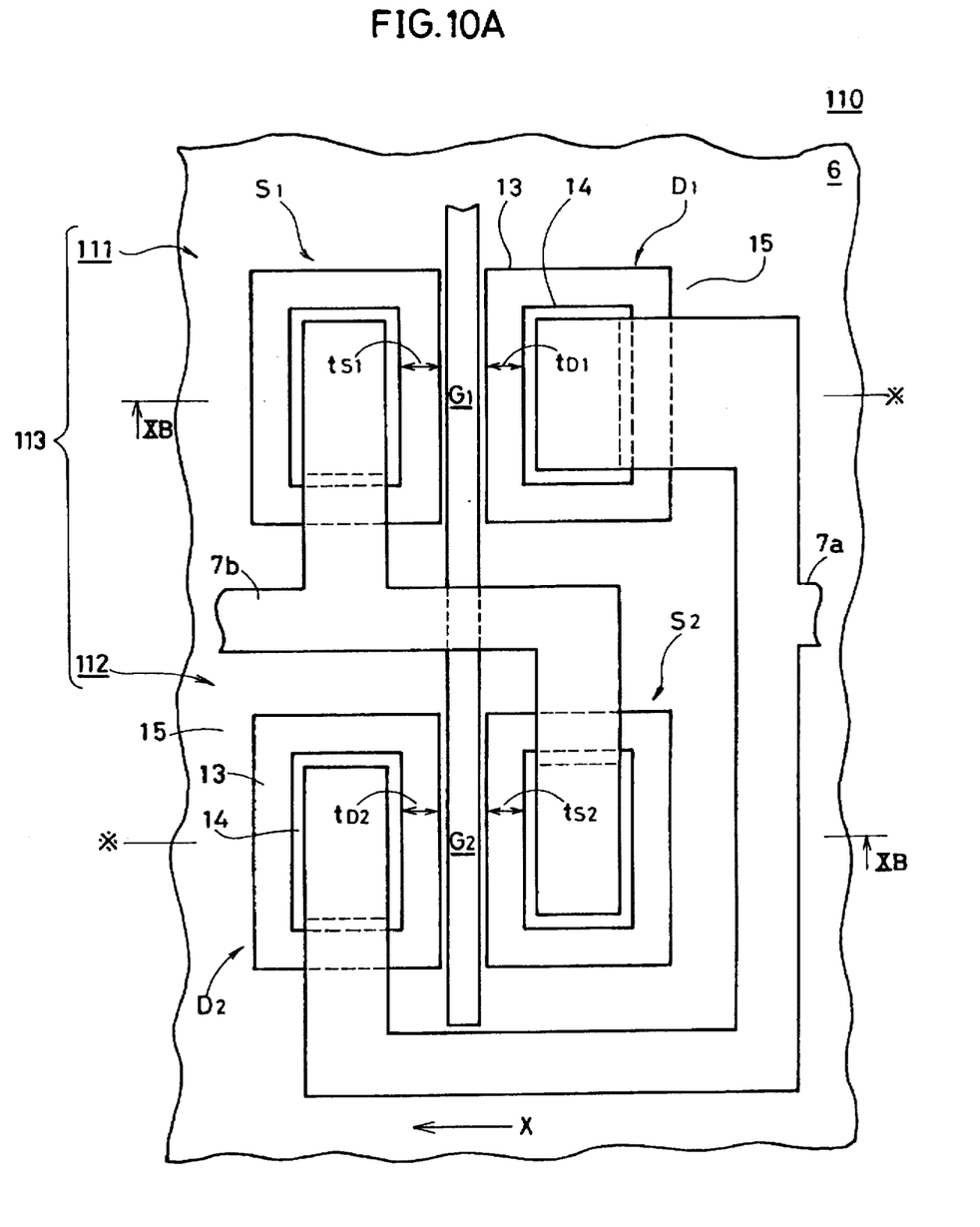
FIG. 10A is a plan view showing an FET according to a second embodiment of the present invention.

FIG. 10A shows another embodiment of the present invention. FIG. 10A corresponds to FIG. 6A. In FIG. 6A, four transistors are arranged in series in the direction of the source S and the drain D. On the other hand in FIG. 10A, two transistors are arranged such that gate electrodes are arranged in line.

Figure 10B:
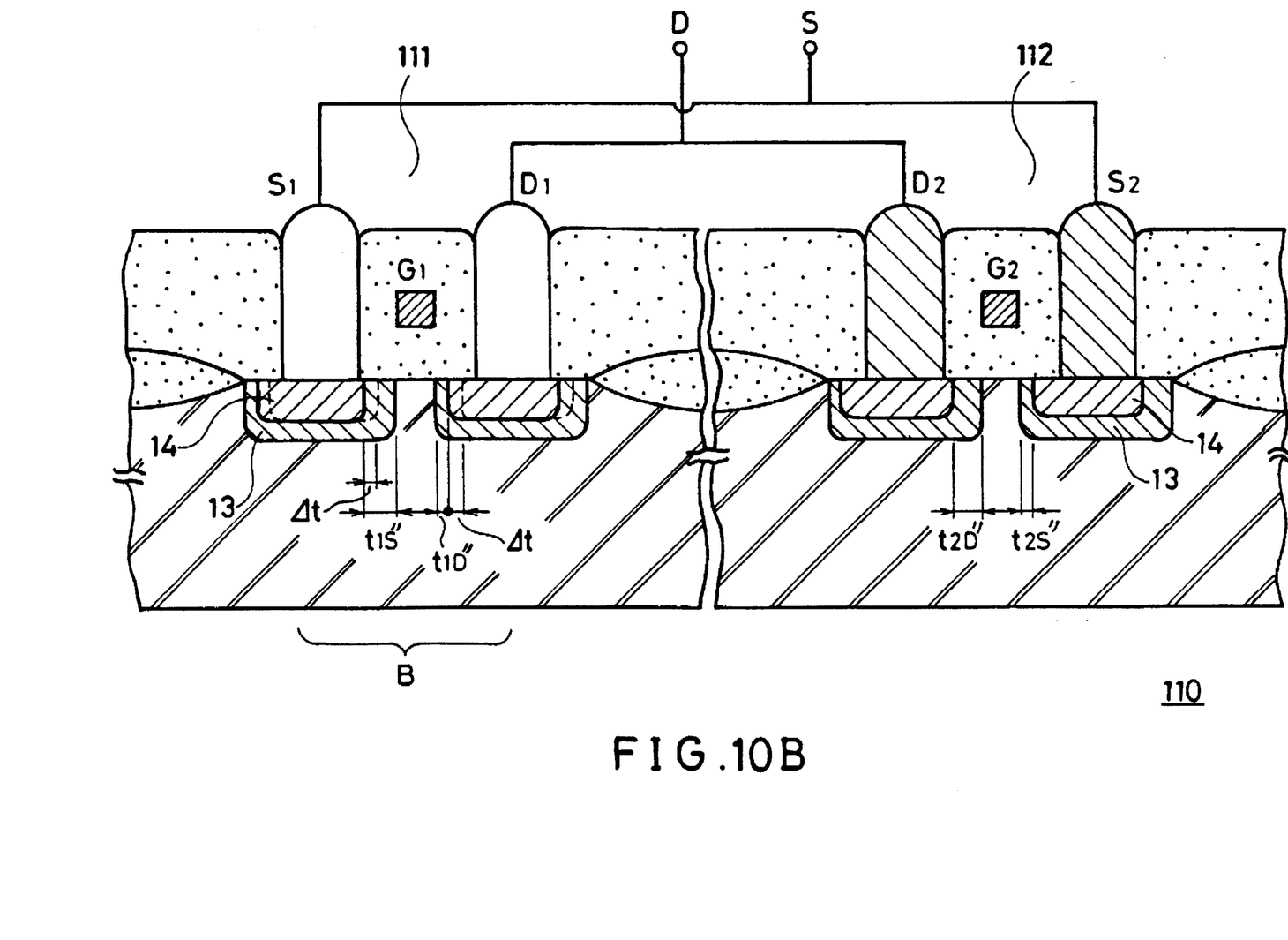
FIG. 10B is a cross sectional view of a portion taken along a line XB—XB shown in, FIG. 10.

FIG. 10B is a cross sectional view of a portion taken along a line. XB—XB shown in FIG. 10A. Constituent elements shown in FIGS. 10A and 10B, are the same as those shown in FIGS. 6A and 6B.

Figure 11:
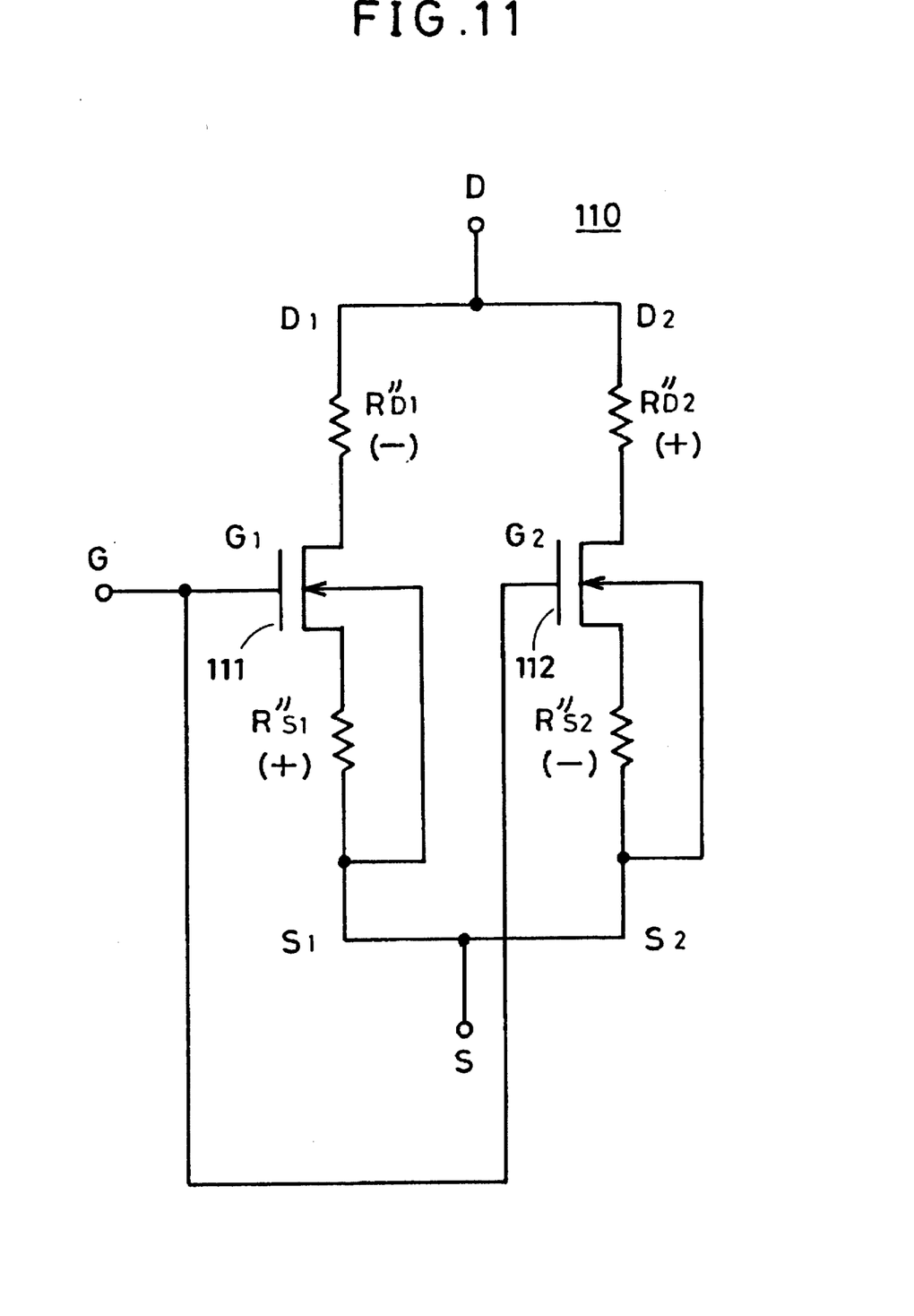
FIG. 11 is a diagram showing an equivalent circuit of the FET according to the second embodiment of the present invention.

In FIGS. 10A and 10B, an MOSFET 110 comprises a first unit. MOSFET 111 having a gate $G_1$, a drain $D_1$ and a source $S_1$, a second unit MOSFET 112 having a gate $G_2$, a drain. $D_2$ and a source $S_2$, and aluminum interconnectiors 7$a$ and 7$b$. The gates $G_1$ and $G_2$ are integrally connected to each other. The drains $D_1$ and $D_2$ are connected to each other by the aluminum interconnection 7$a$ and the sources $S_1$ and $S_2$ are connected to each other by the aluminum interconnection 7$b$. Thus, the MOSFET 110 includes a pair 113 of unit transistors comprising a combination of the first and second unit MOSFETs 111 and 112. The parallel connection of the first and second unit MOSFETS 111 and 112 constitutes the MOSFET 110. FIG. 11 shows an equivalent circuit of the MOSFET 110. The gates $G_1$ and $G_2$, the drains $D_1$ and $D_2$ and the sources $S_1$ and $S_2$ are connected to each other, respectively. Nodes thereof are represented by symbols G, D and S, respectively.

Referring to FIG. 10B, in the first unit MOSFET 111, the drain $D_1$ is formed on the right of the gate $G_1$. In the second unit MOSFET 112, the drain $D_2$ is formed on the left of the gate $G_2$. In the first and second unit MOSFETs 111 and 112, the positional relations between the drain $D_1$ and the source $S_1$ and between the drain $D_2$ and the source $S_2$ are reversed with respect to the respective gates $G_1$ and $G_2$.

Description is made on the case in which in the MOSFET 110 having the above described structure, the N$^+$ diffusion region 14 is formed, shifted, for example, left (in the direction represented by an arrow X in FIG. 10A) by the error of masks alignment.

Referring to FIG. 10B, in the first unit MOSFET 111, the width $t_{1S''}$ of the N$^-$ diffusion region 13 on the side of the source $S_1$ is increased while the width $t_{1D''}$ of the N$^-$ diffusion region 13 on the side of the drain $D_1$ is decreased. Contrary to this, in the second unit MOSFET 112, the width $t_{2D''}$ of the N$^-$ diffusion region a 13 on the side of the drain $D_2$ is increased while the width $t_{2S''}$ of the N$^-$ diffusion region 13 on the side of the source $S_2$ is decreased. Thus, the resistance values presented in the N$^-$ diffusion region 13 are increased in the portions corresponding to the widths $t_{1S''}$ and $t_{2D''}$ while being decreased in the portions corresponding to the widths $t_{2S''}$ and $t_{2D''}$.

Referring to the equivalent circuit shown in FIG. 11, description, is made on this state. Resistances $R_{S1''}$ and $R_{D2''}$ each having a "+" mark are increased with increasing the widths $t_{1S''}$ and $t_{2D''}$ shown in FIG. 10B. Resistances $R_{D1''}$ and $R_{S2''}$ each having a "–" mark are decreased with decreasing the widths $t_{1D''}$ and $t_{2S''}$. Thus, as described in FIG. 9 the substantial combined value of the resistances $R_{D1''}$ and $R_{D2''}$ on the side of the drain D and the substantial combined value of the resistances $R_{S1''}$ and $R_{S2''}$ on the side of the sources become zero or values close to zero, respectively. As a result, $V_{GS}$ and $V_{DS}$ in the equations (1) are not affected by the error of mask alignment, so that the current $I_{DS}$ hardly changes.

In the MOSFET 110 according to the above described embodiments, currents flowing through the respective channels are cancelled. Thus, the entire MOSFET is not affected by the error of mask alignment. As a result, the electrical characteristics of the MOSFET 110 is stabilized, so that the high breakdown voltage is maintained.

Although in the above described embodiments, description was made on the N-channel MOSFET of a silicon gate type, the present invention can be also applied to a P-channel MOSFET. In addition, the present invention can be also applied to the other MOSFET such as $G_aA_s$, an MOSFET of an aluminum gate type, and an FET of a junction type.

As can be seen from FIGS. 6A and 10A, the present invention utilizes the fact that the change in the whole of resistances is cancelled by a combination of a plurality of unit MOSFETs. Thus, it is desirable to provide a plurality of unit MOSFETs. In this case, only an odd number of (three or more) active regions in all for forming a drain and a source are required. Correspondingly, an even number of conductive regions for forming a gate is required. When the number of unit MOSFETs is large, the rate contributed to by a single unit MOSFET in a combined resistance is relatively lowered, so that the number of unit MOSFETs need not be odd. One of the drain and the source maybe formed by a single active region.

Although in the above described embodiments, the drain and the source are formed by double diffusion, only either one thereof may be formed by double diffusion. An active region forming the drain and the source may be formed using not impurity diffusion but the other impurity introducing method such as impurity implantation.

The FET according to the present invention has a large breakdown voltage because the source and drain regions have double diffusion layers, respectively. Since an interval between the double diffusion layers is formed by mask alignment, the FET has a larger breakdown voltage than that of the conventional LDD transistor. Even if the plurality of source regions and drain regions formed by mask alignment have respective different resistance values by the error of mask alignment, the plurality of source regions and drain regions are connected to each other, respectively, such that the respective resistance values thereof are cancelled. Thus, the variations in the respective resistance values of the source regions and drain regions do not affect electrically characteristics of the FET. As a result, there is provided an FET having a double diffusion layer which is electrically stable.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An FET comprising:
    a semiconductor substrate of a first conductivity type having a major surface and a predetermined impurity concentration,
    a plurality of first impurity regions of a second conductivity type formed spaced from each other at predetermined intervals in the major surface of said semiconductor substrate and each having a first impurity concentration,
    regions in the major surface of said semiconductor substrate and between the first impurity regions of the second conductivity type defining channel regions, the length of said channel regions being uniform and in alignment with said conductive layers,
    conductive layers formed over the channel regions through an insulating film and connected to each other,
    second impurity regions of the second conductivity type formed in the major surface of said semiconductor substrate and completely within said first impurity regions of the second conductivity type each having a second impurity concentration higher than said first impurity concentration,
    means for decreasing the parasitic resistance of the FET comprising:
        a first terminal connecting together alternate second impurity regions of the second conductivity type, and
        a second terminal connecting together the remaining second impurity regions of the second conductivity type, wherein
    said first impurity regions of the second conductivity type comprise an odd number of first impurity regions of the second conductivity type arranged in a line manner,
    said second impurity regions of the second conductivity type are formed, shifted in direction of the line, and
    said first terminal connects an odd number of the second impurity regions of the second conductivity type, wherein
    pairs of first impurity regions of the second conductivity type are arranged in parallel such that said conductive layers are arranged in a line manner, and
    said second impurity regions of the second conductivity type are formed, shifted in a direction intersecting with said line direction.

2. An FET according to claim 1, wherein said conductive layers comprise polysilicon.

3. An FET according to claim 1, wherein said impurity regions comprise impurity diffused layers.

* * * * *